US007012343B2

(12) United States Patent
Inn et al.

(10) Patent No.: US 7,012,343 B2

(45) Date of Patent: Mar. 14, 2006

(54) RESISTANCE MULTIPLIER CIRCUIT AND COMPACT GAIN ATTENUATOR

(75) Inventors: Bruce L. Inn, San Jose, CA (US); Matthew Weng, Milpitas, CA (US)

(73) Assignee: Micrel, Inc., San Jose, CA (US)

(*) Notice: Subject to any disclaimer, the term of this patent is extended or adjusted under 35 U.S.C. 154(b) by 425 days.

(21) Appl. No.: 10/412,433

(22) Filed: Apr. 11, 2003

(65) Prior Publication Data

US 2004/0201280 A1 Oct. 14, 2004

(51) Int. Cl.
*H02J 1/00* (2006.01)

(52) U.S. Cl. ........................................ 307/31; 330/256

(58) Field of Classification Search .................. 307/31
See application file for complete search history.

(56) References Cited

U.S. PATENT DOCUMENTS 5,471,173 A * 11/1995 Moore et al. ............... 330/256
5,734,295 A * 3/1998 Kagawa ...................... 329/305
2004/0251965 A1 * 12/2004 Ueda et al. ................. 330/256

OTHER PUBLICATIONS

De Veirman, G.A. The VLSI Handbook, 2000, CRC Press LLC, Chapter 20, pp. 15-16.*

* cited by examiner

*Primary Examiner*—Brian Sircus
*Assistant Examiner*—Dru Parries
(74) *Attorney, Agent, or Firm*—Patent Law Group LLP; Carmen C. Cook

(57) ABSTRACT

A resistance multiplier circuit coupled to a first node of a first circuit for providing a high-value resistance at the first node includes a first transistor, a second transistor being N times larger than the first transistor, and a resistor. In one embodiment, the first and second transistors are NPN bipolar transistors. The first transistor has its base and collector terminals coupled to the first node and an emitter terminal coupled to a second node. The second transistor has a base terminal coupled to the first node, a collector terminal coupled to a positive supply voltage, and an emitter terminal coupled to the second node. The resistor is coupled between the second node and a virtual ground node. When a voltage is applied to the first node, the resistance at the first node is (N+1) times the resistance of the resistor.

20 Claims, 5 Drawing Sheets

RESISTANCE MULTIPLIER CIRCUIT AND COMPACT GAIN ATTENUATOR

FIELD OF THE INVENTION

The invention relates to a circuit for providing a high-value resistance in an integrated circuit and, in particular, to a circuit for multiplying the resistance value of a resistor so that a high-value resistance can be provided in less area and with stable operation characteristics.

DESCRIPTION OF THE RELATED ART

In integrated circuit designs, a high-value resistance is often needed. Directly creating such a high-value resistance element may be either unfeasible or undesirable due to tradeoffs that need to be made in performance and/or size of such a resistance element. For example, one conventional method for realizing high-value resistances in an integrated circuit includes using a silicon resistance such as the base region of an NPN bipolar transistor to form the resistance element. While using the NPN base region offers the best accuracy and best thermal and voltage coefficients, typical resistivities are so low as to make high-value resistances very area-consuming. For instance, a typical sheet resistance of the base region is 2 kohm/square. To obtain a 500 kohm resistor will require 250 squares. Not only is the area consumed by 250 squares significant, but the capacitance associated with the resulting resistance element is undesirably large, causing significant degradation in the element's frequency response.

Another convention method for realizing high-value resistances in an integrated circuit involves using a weakly-enhanced, long-channel length MOS transistor. Although such as resistance element may provide a more compact realization than the previous method, the resistance value will vary more widely over process condition and temperature variations.

Finally, another conventional method for realizing high-value resistance involves using a high-resistivity material such as a lightly-doped polysilicon layer or the silicon well region. The disadvantage with using either of these structures is the large temperature coefficient and large voltage coefficient of resistance exhibited by resistors made of these materials.

The conventional methods for providing high-value resistance in an integrated circuit are undesirable as they either require large silicon area to implement or the resulting resistance element exhibits large resistance variations due to processing conditions, operating temperature, and voltage variations. Therefore, a method for providing a high-value resistance in an integrated circuit without the aforementioned shortcomings is desired.

SUMMARY OF THE INVENTION

According to one embodiment of the present invention, a circuit coupled to a first node of a first circuit includes a first transistor, a second transistor being N times larger than the first transistor, and a resistor for providing a resistance value at the first node that is a multiple of the resistance value of the resistor. The first transistor has a control terminal and a first current handling terminal coupled to the first node and a second current handling terminal coupled to a second node. The second transistor has a control terminal coupled to the first node, a first current handling terminal coupled to a first supply voltage, and a second current handling terminal coupled to the second node. The resistor is coupled between the second node and a second supply voltage.

As thus configured, the first and second transistors form a current mirror with the second transistor draws N times more current than the first transistor. In operation, when a voltage is applied to the first node, a resistance value being (N+1) times the resistance of the resistor is established at the first node.

The first and second transistors can be implemented using NPN bipolar transistors, PNP bipolar transistors, NMOS transistors, or PMOS transistors.

The present invention is better understood upon consideration of the detailed description below and the accompanying drawings.

DETAILED DESCRIPTION OF THE PREFERRED EMBODIMENTS

In accordance with the principles of the present invention, a circuit for providing a high-value resistance to a first node uses active circuitry to multiply the resistance value of a resistor. In this manner, a high-value resistance can be provided in an integrated circuit by using a comparatively small structure. In one embodiment, the resistance multiplier circuit includes a pair of unevenly sized transistors coupled to the first node and to a resistor. The transistors are configured as a current mirror for drawing currents through the resistor. By discarding part of the current drawn, the resistance value as seen from the first node can be made larger than actual resistance of the resistor itself. The geometric ratio of the pair of transistors establishes the amount of resistance multiplication that can be realized.

The resistance multiplier circuit of the present invention offers many advantages. First, the resistance multipler circuit including two transistors requires less silicon area to implement while providing for very high resistance values. Second, the circuit can achieve stability over process variations and over operating temperature and voltage variations. Lastly, because the circuit can achieve large resistance in a small area, the parasitic capacitance of the resulting structure is much lower than that of the conventional structures described above.

Figure 1:
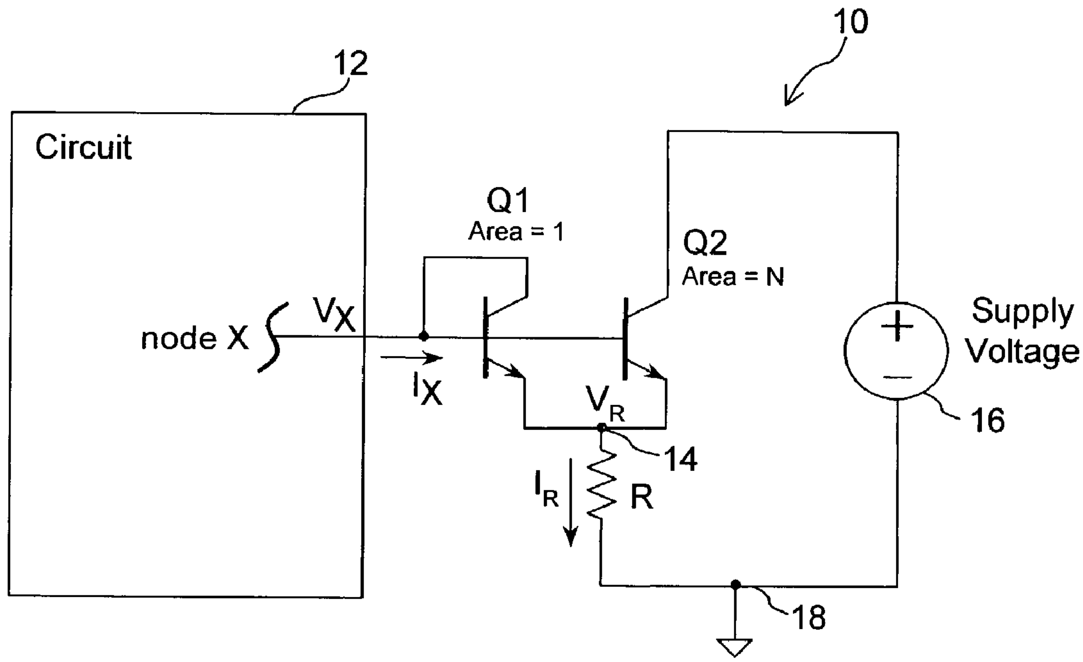
FIG. 1 is a circuit diagram of a resistance multiplier circuit according to one embodiment of the present invention.

FIG. 1 is a circuit diagram of a resistance multiplier circuit according to one embodiment of the present invention. Referring to FIG. 1, resistance multiplier circuit 10 is coupled to a node X of a circuit 12 to which a high resistance value is desired. Circuit 12 can be any circuitry and is typically fabricated as an integrated circuit. Resistance multiplier circuit 10 includes an NPN bipolar transistor Q1 and an NPN bipolar transistor Q2, where the emitter area of transistor Q2 is N times the emitter area of transistor Q1. Transistor Q1 has its base and collector terminals coupled to node X and its emitter terminal coupled to a node 14. Transistor Q2 has its base terminal coupled to node X, its collector terminal coupled to a voltage source 16 which is the positive supply voltage for circuit 12, and its emitter terminal coupled to node 14. As thus configured, transistors Q1 and Q2 have the same base-to-emitter voltages and are connected as a current mirror. The geometric ratio of the two transistors determines the amount of current flowing in each transistor. Thus, the current flowing in transistor Q2 is N times the current flowing in transistor Q1.

A resistor R is coupled to the emitter terminals of transistors Q1 and Q2 (node 14) and a virtual ground node (node 18). Virtual ground node 18 can be the ground potential or a negative supply voltage of circuit 12. The emitter currents from transistors Q1 and Q2 flow into resistor R and a voltage VR is established at node 14. The current flowing through resistor R is given by $I_R=V_R/R$. Resistance multiplier circuit 10 operates to provide a multiple of the resistance of resistor R at node X where the amount of multiplication is determined by the geometric ratio of transistors Q1 and Q2. Specifically, the resistance as seen from node X is (N+1) times the resistance of R, as will be explained below. Because the area ratio N is a fixed number and does not vary with operating temperature, operating voltages or processing conditions, the high-value resistance obtained at node X as a result of multiplying resistor R exhibits stable operating characteristics over temperature, voltage and process condition variations.

In operation, it is assumed that node X presents a voltage Vx to the base terminals of transistors Q1 and Q2. As a result of the application of voltage Vx, transistors Q1 and Q2 are turned on and emitter currents from each transistor flow into resistor R. Thus, current IR represents the sum of the emitter currents from transistors Q1 and Q2. Specifically, if an emitter current $I_E$ flows in transistor Q1, an emitter current $N*I_E$ will flow in transistor Q2. Consequently, resistor current $I_R$ is $(N+1)I_E$.

Resistance multiplier circuit 10 splits the resistor current $I_R$ through resistor R and "throws away" a fraction of the resistor current to a convenient system potential, such as the virtual ground node 18. The portion of current (current Ix) not diverted to the virtual ground node is directed into node X to which a high resistance is established. In accordance with the present invention, by virtue of connecting the collector terminal of transistor Q2 to the supply voltage, the current in transistor Q2 is being discarded while the current in transistor Q1 is being directed into node X as current Ix. Thus, the fraction of current $I_R$ being thrown away is the current in transistor Q2 and is given by N/(N+1), where N is the emitter area ratio of transistors Q1 and Q2.

Node X, therefore, sources a small signal current given by:

$$I_x=V_x/(R^*(N+1)).$$

According to the above relationship, the effective small-signal resistance looking out from node X is approximately:

$$R_x=R^*(N+1).$$

The above equation holds if the small-signal emitter impedance of transistor Q1 is much smaller than the resistance R. This condition is met if the voltage drop across the resistor R (voltage $V_R$) is much greater than 1/N times the thermal voltage $V_T$ given by $V_T$=kT/q (26 mV at 300K).

As a result of developing a current of $(N+1)I_E$ at resistor R and throwing away N/(N+1) amount of the resistor current in transistor Q2, a high-value resistance is established at node X where the resistance $R_x$ is (N+1) times the resistance of resistor R. In this manner, a very high resistance value can be provided to circuit 12 by using a relatively small resistor R.

Figure 2:
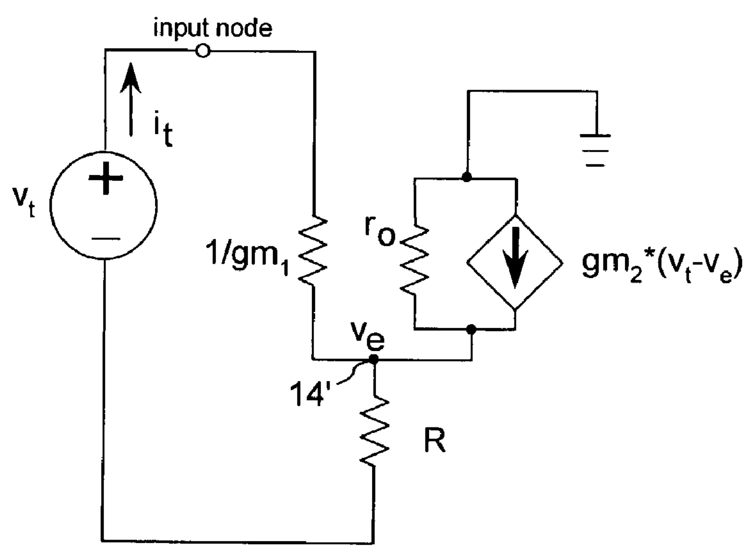
FIG. 2 is a small signal circuit model of resistance multiplier circuit of FIG. 1.

The operational principles of resistance multiplier circuit 10 can be examined using the following small signal analysis. FIG. 2 is a small signal circuit model of resistance multiplier circuit 10. In the small signal circuit model, a voltage source applying a test voltage $v_t$ to an input node models the input voltage to the resistance multiplier circuit. The small signal circuit can then be used to compute the input current it at the input node. Transistor Q1 is modeled as a resistive element having a resistance value of $1/gm_1$ and is connected between the input node and resistor R at node 14'. Transistor Q2 is modeled as a resistance element having a resistance value $r_o$ (the output impedance of transistor Q2) in parallel with a current source providing a current $gm_2*(v_t-v_e)$, where voltage ve is the emitter voltage of transistors Q1 and Q2 and is also the voltage across resistor R. Resistor $r_o$ and current source $gm_2*(v_t-v_e)$ are connected between a virtual ground node and resistor R at node 14'.

Applying Kirchhoff's Current Law to the emitter node (node 14') of the small signal circuit, the following equation results:

$$v_e/r_o-gm_2(v_t-v_e)+v_e/R-i_t=0. \quad \text{Eq. (1)}$$

Collecting terms and substituting the following terms for $gm_2$ and $v_e$:

$$gm_2=N*gm_1 \text{ and}$$

$$v_e=v_t-(i_t/gm_1),$$

the following equation for a resistance $r_t$ at the input node is derived:

$$r_t=\frac{v_t}{i_t}=\frac{r_O+R+(N+1)\times gm_1\times r_O\times R}{gm_1\times(r_O+R)}. \quad \text{Eq. (2)}$$

Equation (2) above can be simplified by applying the following assumptions. First, the output impedance $r_o$ of transistor Q2 is assumed to be much greater than the discrete resistor R. The output impedance of transistor Q2 has to be large so that the current drawn from the test excitation source $v_t$ is virtually equal to the current through the resistor R. By making the resistance of resistor R small in comparison to the output impedance $r_o$, the output impedance $r_o$ draws insignificant amounts of current compared to the resistance R.

Second, the combined emitter conductance (N+1)*gm1 of the two transistors is assumed to be much greater than the discrete conductance 1/R. In other words, the small signal emitter resistance of the two transistors Q1 and Q2 should be much smaller than the resistance of resistor R so that the emitters of the transistors can drive the voltage on the emitter node 14'. In this manner, the signal at the emitter terminals of the transistors will track the signal at the base terminals in the AC mode. If the above two conditions are met, then the AC signals impressed at the input node (such as voltage vt) result in a current change that is determined only by resistor R and not by the output impedance of transistor Q2.

Applying the above two assumptions to Equation (2), the equation can be simplified as follows. First by applying the assumption $r_o$>>R and collecting terms:

$$\begin{aligned} r_t &= \frac{v_t}{i_t} \\ &= \frac{r_O + (N+1)\times gm_1 \times r_O \times R}{gm_1 \times r_O}; \\ &= \frac{r_O(1 + (N+1)\times gm_1 \times R)}{gm_1 \times r_O}; \\ &= \frac{1 + (N+1)\times gm_1 \times R}{gm_1}; \text{ and} \\ &= \frac{1}{gm1} + (N+1)R. \end{aligned}$$

Then by applying the assumption $(N+1)gm_1>>1/R$ or $(N+1)R>>1/gm_1$, the intuitive result for resistance $r_t$ at the input node of the resistance multiplier circuit is obtained:

$$r_t=(N+1)R.$$

Note that the above assumptions can be met as long as a resistance value for resistor R is chosen so that the voltage drop across resistor R is much larger than the thermal voltage $V_T$ (or kT/q).

The small signal circuit analysis above illustrates that an effective resistance $R_x$ that is (N+1) times the resistance of the resistor R can be realized at the input node X by using the resistance multiplier circuit of the present invention.

In the operation of resistance multiplier circuit 10, a portion of the supply current generated is thrown away. Specifically, N/(N+1) portion of the current drawn out of the resistor R is discarded. Therefore, the resistance multiplier circuit of the present invention increases the overall supply current for circuit 12 as compared to the case when a direct realization of a high resistance element is used. However, in many practical cases, the extra "throw-away" current will not be large enough to present a problem to the operation of circuit 12 as the current drawn by a high-value resistance is, by definition, very small and therefore the "throw-away" current is not very large in comparison.

In the present embodiment, resistor R is fabricated as a base diffusion resistor in an integrated circuit. In other embodiments, other structures, such as a polysilicon layer or an enhancement mode MOS transistor, can be used to form resistor R, as is well understood by one skilled in the art.

Figure 3:
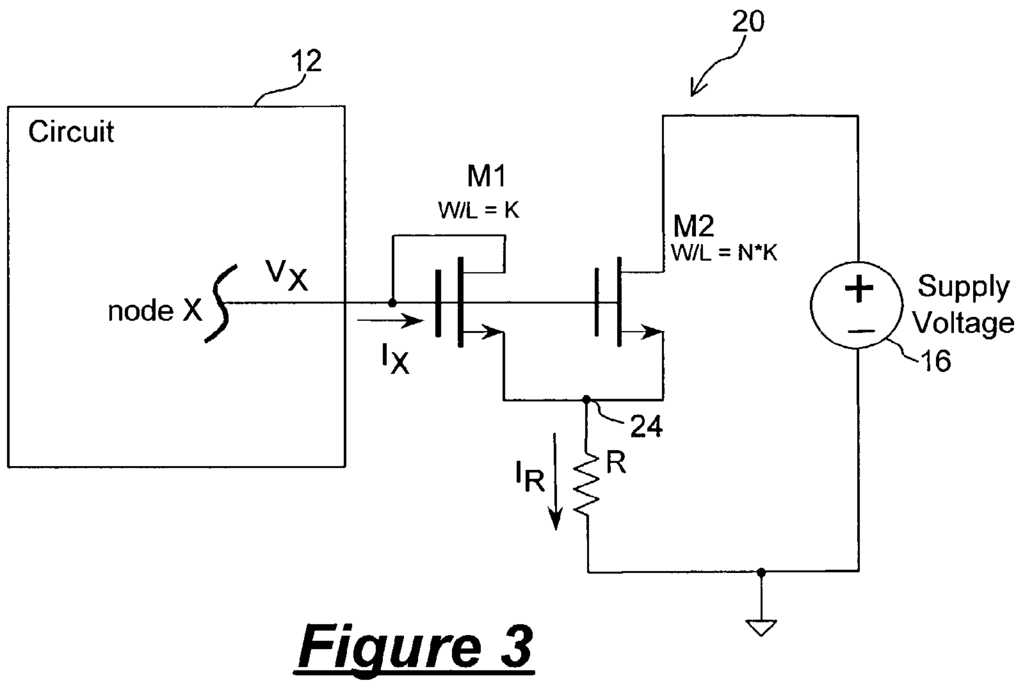
FIG. 3 is a circuit diagram of a resistance multiplier circuit according to an alternate embodiment of the present invention.

The use of NPN bipolar transistors in resistance multiplier circuit 10 is illustrative only. The resistance multiplier circuit of the present invention can also be constructed using other transistor devices depending on the application. FIG. 3 is a circuit diagram of a resistance multiplier circuit according to an alternate embodiment of the present invention. Resistance multiplier circuit 20 is constructed using a pair of N-channel MOS field effect transistors (NMOS transistors) M1 and M2 where the width-to-length ratio of transistor M2 is N times larger than the width-to-length ratio of transistor M1. Transistor M1 is diode-connected while the drain terminal of transistor M2 is connected to voltage source 16. The source terminals of transistors M1 and M2 are both connected to resistor R (node 24) so that the currents through transistors M1 and M2 are summed at node 24 and the summed current flows in resistor R. The operation of resistance multiplier circuit 20 is analogous to that of resistance multiplier circuit 10 of FIG. 1 and a high-value resistance being a multiple of resistor R is established at node X. Specifically, the resistance Rx at node X is (N+1) times the resistance of resistor R.

Figure 4:
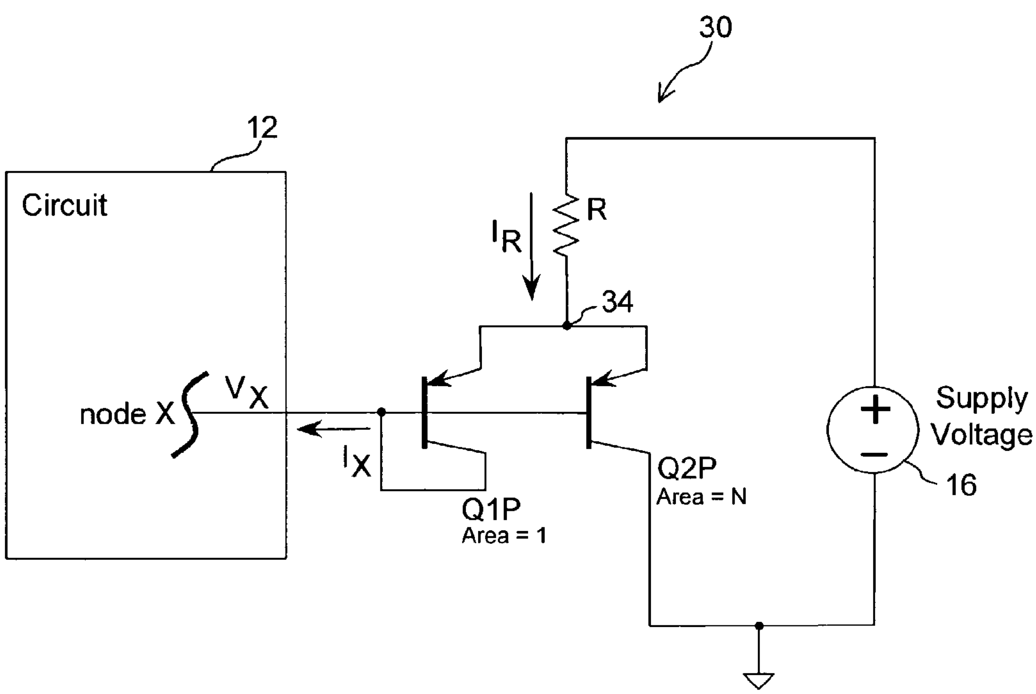
FIG. 4 is a circuit diagram of a resistance multiplier circuit according to yet another alternate embodiment of the present invention.

FIG. 4 is a circuit diagram of a resistance multiplier circuit according to yet another alternate embodiment of the present invention. In resistance multiplier circuit 30 of FIG. 4, a pair of PNP bipolar transistors Q1P and Q2P is used. The polarities of the circuit nodes are thus reversed so that resistor R is coupled between the positive supply voltage (voltage source 16) and the emitter terminals (node 34) of transistors Q1P and P2P. The collector terminal of transistor Q2P is coupled to a virtual ground node, such as a ground potential. The operation of resistance multiplier circuit 30 is analogous to resistance multiplier circuit 10 of FIG. 1, with the polarities of the voltage and current reversed. As a result of drawing (N+1) $I_E$ current through resistor R and throwing away N/(N+1) portion of the current through transistor Q2P, a resistance $R_x$ at node X which is an (N+1) multiple of the resistance of resistor R is realized.

Of course, in another embodiment, the resistance multiplier circuit of the present invention can be implemented using PMOS transistors in place of the PNP bipolar transistors in FIG. 4.

Figure 5:
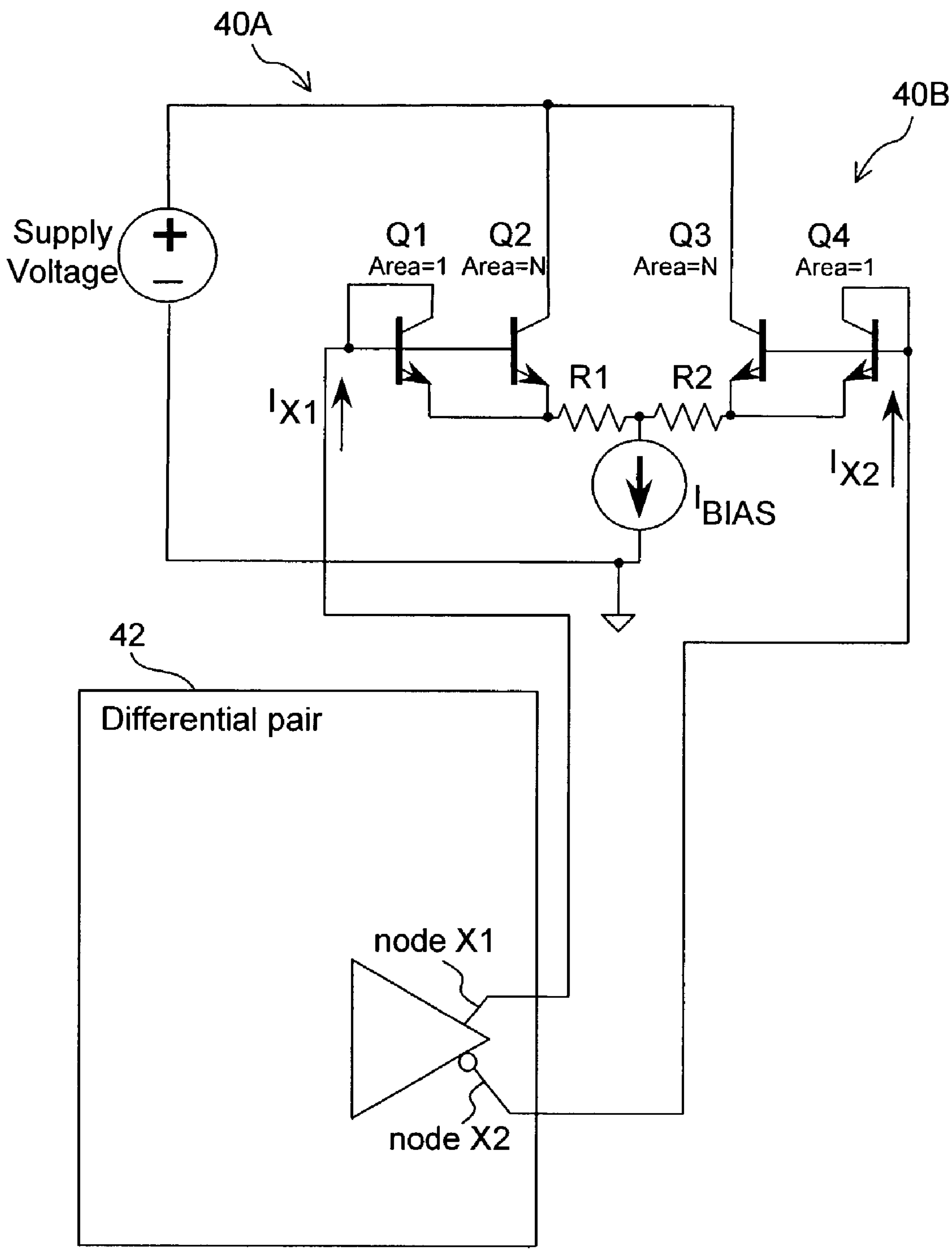
FIG. 5 illustrates a circuit arrangement in which the resistance multiplier circuit of the present invention is coupled to provide a floating, non-grounded resistance for differential signals.

FIG. 5 illustrates a circuit arrangement in which the resistance multiplier circuit of the present invention is coupled to provide a floating, non-grounded resistance for differential signals. Referring to FIG. 5, a pair of resistance multiplier circuits 40A and 40B are coupled to provide high-value resistances to differential nodes X1 and X2 in a circuit 42. For example, nodes X1 and X2 can be the output nodes of a differential pair. The effective resistance between nodes X1 and X2 is (N+1)*2R.

In the circuit arrangement of FIG. 5, a bias current $I_{bias}$ is coupled between resistors R1, R2 and the virtual ground node to bias up the currents at the resistors. Bias current $I_{bias}$ is needed to ensure that the impedance looking into the emitter terminals of the transistors from the resistors will be lower than the resistance of resistors R1 and R2. For example, if there is a large differential between currents $I_{X1}$ and $I_{X2}$, one of the resistance multiplier circuits 40A, 40B may not have sufficient bias current so that the impedance at the emitter terminals may become too large. The inclusion of bias current $I_{bias}$ ensures that the resistance multiplier circuits 40A, 40B are biased up properly so that circuits 40A and 40B can operate to multiply the resistance of resistors R1, R2, respectively for providing a high-value resistance between nodes X1 and X2.

In the embodiment shown in FIG. 5, resistance multiplier circuits 40A and 40B are symmetrical and the same transistor size ratio of N is used in both circuits. However, unequal transistor ratios may be employed provided certain conditions are met. Specifically, the output impedance of the current source providing current $I_{bias}$ must be much less than the multiplied resistance divided by the absolute difference of the transistor size ratios. The requirement can be expressed in mathematical terms as follows:

$$r_o << R_{eff}/(\text{abs}(N2-N1))$$

where N2 and N1 are the size ratios of the NPN transistor pairs, $R_{eff}$ is the ideal multiplied resistance, and $r_o$ is the output resistance of the bias current source. This condition ensures that the size ratio mismatch does not result in a significant voltage modulation across the bias source. If a significant voltage modulation were to happen, the current through the resistors R1 and R2 would not be solely determined by the voltage impressed across multiplier circuits 40A and 40B. In any case, the desired size ratios for the pair of resistance multiplier circuits can be selected to obtain the desired resistance value between nodes X1, X2, which resistance values do not have to be equal.

According to one aspect of the present invention, the resistance multiplier circuit is coupled to an amplifier circuit to function as a gain attenuator. Because the resistance multiplier circuit of the present invention can provide a large resistance value in a very small area, effective gain attenuation can be realized in a small area with very stable operating characteristics.

In amplifier circuits, it is quite often advantageous to limit the gain of the amplifier to make compensation easier. Gain attenuation can be done by degenerating the input structure. But common methods of degenerating the gain structure introduce offset voltages that can be significant. Thus, in some cases, it would be preferable to decrease the output impedance of the amplifier, such as by attaching a resistor having a resistance value somewhat lower than the nodal dynamic resistance of the output of the amplifier. But the appropriate value of such a resistor is typically in the hundreds of kilo-Ohms. When the conventional methods are used to implement such a resistor having a large resistance, the resulting resistor structure is large in size and has associated with it a high parasitic capacitance. Large resistor size is undesirable because it increases product cost and component tolerances. High capacitance is a drawback because it narrows the frequency response of the associated node. Therefore, the conventional resistor structures are undesirable for use in gain attenuation.

Figure 6:
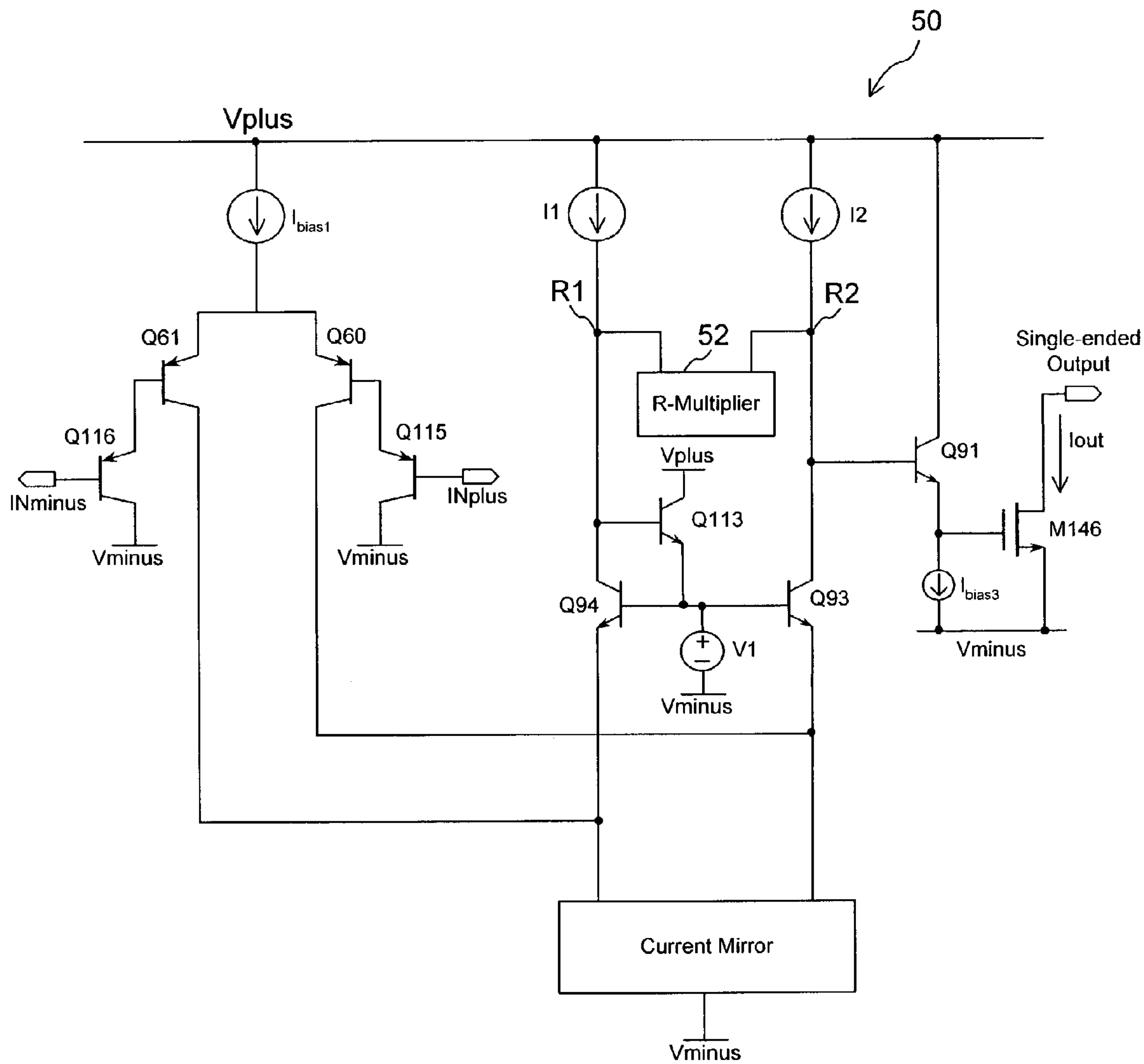
FIG. 6 illustrates an amplifier circuit incorporating a resistance multiplier circuit according to one embodiment of the present invention.

Because the resistance multiplier circuit of the present invention can provide a large resistance value in a relatively small area, the resistance multiplier circuit can be advantageously applied to an amplifier circuit as a gain attenuator. FIG. 6 illustrates an amplifier circuit 50 incorporating a resistance multiplier circuit according to one embodiment of the present invention.

Referring to FIG. 6, input signals INplus and INminus to amplifier circuit 50 are coupled to the base terminals of PNP transistors Q115 and Q116, respectively. Transistors Q115 and 116, together with PNP differential stage formed by transistors Q60 and 61, form a transconductance stage. The PNP differential stage of transistors Q60 and Q61 feeds an active-load stage consisting of a current mirror (NPN transistors Q93, Q94, and Q113) and high-side current sources 11 and 12. Current sources I1 and I2 can be implemented using PMOS transistors. The active load stage feeds a ground-referenced single-ended signal into the base terminal of an NPN transistor Q91 configured as a follower. Transistor Q91 drives the final output device, M146. The single-ended output signal of amplifier circuit 50 is provided at the drain terminal of transistor M146. The resulting gain of amplifier circuit 50 is very high. Therefore, in the present illustration, it is necessary to lower the gain by 10 without significantly altering the structure of the amplifier.

The first gain point in the amplifier circuit is at the output node of the active load stage (node R2), where the gain is given by the transconductance of the PNP input stage (Q60 and Q61) multiplied by the nodal impedance of the active load output nodes (nodes R1 and R2). In one exemplary fabrication process, the nodal impedance is about 4 Mohms. To attenuate the gain by a factor of 10, a 400 kohms resistance to ground is required at both output nodes R1 and R2 of the active load stage. That is, a 400 kohms resistance is required at each of nodes R1 and R2.

Because a 400 kohms resistance is quite large, it is not feasible to use conventional methods to implement such large resistance. In amplifier circuit 50, the necessary gain attenuation resistances are implemented using the resistance multiplier circuit of the present invention. Specifically, a resistance multiplier circuit 52 is coupled to nodes R1 and R2 to provide the necessary resistances at the respective nodes.

Figure 7:
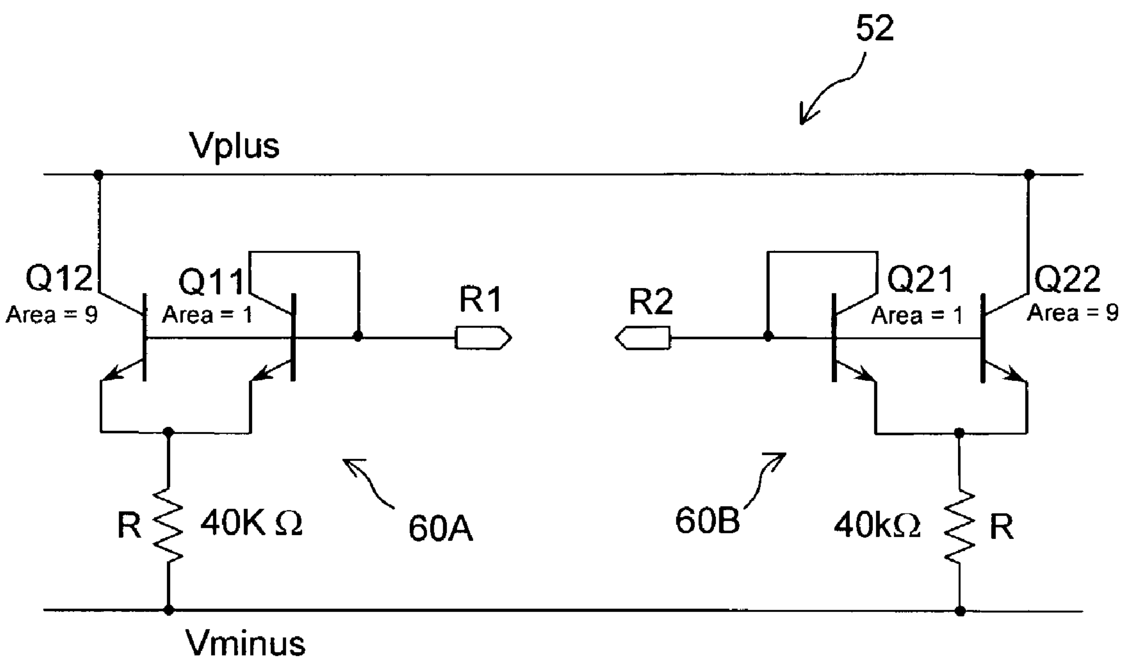
FIG. 7 illustrates an implementation of the resistance multiplier circuit in the amplifier circuit of FIG. 6 according to one embodiment of the present invention.

FIG. 7 illustrates an implementation of the resistance multiplier circuit 52 in amplifier circuit 50 according to one embodiment of the present invention. In the present embodiment, resistance multiplier circuit 52 includes a two separate resistance multiplier circuits 60A and 60B, each providing 400 kohms resistance to the respective output node of the active load stage. Referring to FIG. 7, in resistance multiplier circuit 60A, a 40 kohms resistor is coupled to the current mirror formed by NPN transistors Q11 and Q12. Transistors Q11 and Q12 have a 9 to 1 size ratio. Therefore, at node R1, a resistance value to ground of (9+1)*40 kohms or 400 kohms is realized. Similarly for resistance multiplier circuit 60B, a 40 kohms resistor is coupled to the current mirror formed by NPN transistors Q21 and Q22 having a 9 to 1 size ratio. Therefore, a 400 kohms resistance to ground is realized at node R2.

By incorporating resistor multiplier circuit 52 in amplifier circuit 50, a gain reduction by a factor of 10 can be realized without requiring alteration to the structure of the amplifier circuit and without requiring large silicon area to implement. As a result of incorporating resistance multiplier circuit 52 in amplifier circuit 50, the gain of the amplifier circuit is reduced by a factor of 10 and compensation of the amplifier circuit can be now carried out more easily. Furthermore, as a benefit in addition to the gain reduction, the DC currents drawn by resistance multiplier circuit 52 are less than that would be drawn by an equivalent conventional resistor. This is because the voltage drop across the resistors in the resistance multiplier circuit is the output node voltages at nodes R1 and R2 diminished by one base-to-emitter voltage. When conventional resistor structures are used, the DC currents are based on the voltage drops across the resistor structures which are the entire output node voltages at nodes R1 and R2. Because the DC currents drawn by the resistance multiplier circuit are less, offset currents due to the resistor DC currents are also reduced as compared to the case when conventional resistor structures are used.

The above detailed descriptions are provided to illustrate specific embodiments of the present invention and are not intended to be limiting. Numerous modifications and variations within the scope of the present invention are possible. The present invention is defined by the appended claims.

We claim:

1. A circuit coupled to a first node of a first circuit, comprising:

a first transistor having a control terminal and a first current handling terminal coupled to the first node, and a second current handling terminal coupled to a second node;

a second transistor having a control terminal coupled to the first node, a first current handling terminal coupled to a first supply voltage, and a second current handling terminal coupled to the second node; and a resistor coupled between the second node and a second supply voltage, wherein the second transistor is N times larger than the first transistor, and when a voltage is applied to the first node, a resistance value being (N+1) times the resistance of the resistor is established at the first node.

2. The circuit of claim 1, wherein the first supply voltage is a positive supply voltage of the first circuit and the second supply voltage is a virtual ground node.

3. The circuit of claim 2, wherein the first and second transistors each comprises a NPN bipolar transistor, the second transistor having an emitter area N times larger than an emitter area of the first transistor.

4. The circuit of claim 2, wherein the first and second transistors each comprises a NMOS transistor, the width to length ratio of the second transistor being N times the width to length ratio of the first transistor.

5. The circuit of claim 1, wherein the first supply voltage is a virtual ground node and the second supply voltage is a positive supply voltage of the first circuit.

6. The circuit of claim 5, wherein the first and second transistors each comprises a PNP bipolar transistor, the second transistor having an emitter area N times larger than an emitter area of the first transistor.

7. The circuit of claim 5, wherein the first and second transistors each comprises a PMOS transistor, the width to length ratio of the second transistor being N times the width to length ratio of the first transistor.

8. The circuit of claim 1, wherein an output impedance of the second transistor is much larger than the resistance of the resistor.

9. The circuit of claim 1, wherein when a voltage is applied to the first node, a current flows in the resistor such that a voltage across the resistor is much greater than $(1/N)*V_T$, where $V_T$ is the thermal voltage kT/q.

10. The circuit of claim 1, wherein the impedance at the second current handling terminal of the first and second transistors is much smaller than the resistance of the resistor.

11. A circuit, comprising:

a first resistance multiplier circuit providing a first resistance value at a first node, the first resistance multiplier circuit comprising:

a first transistor having a control terminal and a first current handling terminal coupled to the first node, and a second current handling terminal coupled to a third node;

a second transistor having a control terminal coupled to the first node, a first current handling terminal coupled to a first supply voltage, and a second current handling terminal coupled to the third node, wherein the second transistor is N times larger than the first transistor; and a first resistor coupled between the third node and a fourth node;

a second resistance multiplier circuit providing a second resistance value at a second node, the second resistance multiplier circuit comprising:

a third transistor having a control terminal and a first current handling terminal coupled to the second node, and a second current handling terminal coupled to a fifth node;

a fourth transistor having a control terminal coupled to the second node, a first current handling terminal coupled to the first supply voltage, and a second current handling terminal coupled to the fifth node, wherein the fourth transistor is M times larger tan the third transistor, and a second resistor coupled between the fourth node and the fifth node; and a first bias current source coupled between the fourth node and a second supply voltage, wherein when a first voltage is applied to the first node, the first resistance value being established at the first node is (N+1) times the resistance of the first resistor, and when a second voltage is applied to the second node, the second resistance value being established at the second node is (M+1) times the resistance of the second resistor.

12. The circuit of claim 11, wherein N is equal to M.

13. The circuit of claim 11, wherein the first supply voltage is a positive supply voltage and the second supply voltage is a virtual ground node.

14. The circuit of claim 13, wherein the first and second transistors each comprises a NPN bipolar transistor, the second transistor having an emitter area N times larger than an emitter area of the first transistor; and wherein the third and fourth transistors each comprises a NPN bipolar transistor, the fourth transistor having an emitter area M times larger than an emitter area of the third transistor.

15. A circuit coupled to an output terminal of an amplifier circuit for attenuating the gain of the amplifier circuit, the circuit comprising:

a first transistor having a control terminal and a first current handling terminal coupled to the output terminal of the amplifier circuit, and a second current handling terminal coupled to a second node;

a second transistor having a control terminal coupled to the output terminal of the amplifier circuit, a first current handling terminal coupled to a first supply voltage, and a second current handling terminal coupled to the second node, wherein the second transistor is N times larger than the first transistor, and a resistor coupled between the second node and a second supply voltage, wherein when a voltage is applied to the output terminal of the amplifier circuit, a resistance being (N+1) times the resistance of the resistor is established at the output terminal of the amplifier circuit, the resistance operating to attenuate the gain of the amplifier circuit.

16. A circuit coupled to differential output terminals of an amplifier circuit for attenuating the gain of the amplifier circuit, the amplifier circuit including a differential input stage and an active load stage, the circuit comprising:

a first resistance multiplier circuit providing a first resistance value at a first differential output terminal of the amplifier circuit, the first resistance multiplier circuit comprising:

a first transistor having a control terminal and a first current handling terminal coupled to the first differential output terminal, and a second current handling terminal coupled to a first node;

a second transistor having a control terminal coupled to the first differential output terminal, a first current handling terminal coupled to a first supply voltage, and a second current handling terminal coupled to the first node, wherein the second transistor is N times larger than the first transistor; and a first resistor coupled between the first node and a second supply voltage; and a second resistance multiplier circuit providing a second resistance value at a second differential output terminal of the amplifier circuit, the second resistance multiplier circuit comprising:

a third transistor having a control terminal and a first current handling terminal coupled to the second differential output terminal, and a second current handling terminal coupled to a second node;

a fourth transistor having a control terminal coupled to the second differential output terminal, a first current handling terminal coupled to the first supply voltage, and a second current handling terminal coupled to the second node, wherein the fourth transistor is M times larger than the third transistor; and a second resistor coupled between the second node and the second supply voltage, wherein when a first voltage is applied to the first differential output terminal of the amplifier circuit, the first resistance value being established at the first differential output terminal is (N+1) times the resistance of the first resistor, and when a second voltage is applied to the second differential output terminal of the amplifier circuit, the second resistance value being established at the second differential output terminal is (M+1) times the resistance of the second resistor, the first and second resistance values operating to attenuate the gain of the amplifier circuit.

17. The circuit of claim 16, wherein N is equal to M.

18. The circuit of claim 16, wherein the first supply voltage is a positive supply voltage and the second supply voltage is a virtual ground node.

19. The circuit of claim 18, wherein the first and second transistors each comprises a NPN bipolar transistor, the second transistor having an emitter area N times larger than an emitter area of the first transistor; and wherein the third and fourth transistors each comprises a NPN bipolar transistor, the fourth transistor having an emitter area M times larger than an emitter area of the third transistor.

20. A method for providing a first resistance value at a first node, comprising:

coupling a first transistor to the first node, the first transistor having a control terminal and a first current handling terminal both coupled to the first node and a second current handling coupled to a second node;

coupling a second transistor to the first node, the second transistor having a control terminal coupled to the first node, a first current handling terminal coupled to a first supply voltage, and a second current handling terminal coupled to the second node, the second transistor being N dines larger than the first transistor; and coupling a resistor between the second node and a second supply voltage, wherein when a voltage is applied to the first node, the first resistance value at the first node is (N+1) times the resistance of the resistor.

* * * * *